United States Patent
Zehnder et al.

(10) Patent No.: US 7,144,458 B2
(45) Date of Patent: *Dec. 5, 2006

(54) FLOW SYNTHESIS OF QUANTUM DOT NANOCRYSTALS

(75) Inventors: Donald A. Zehnder, San Carlos, CA (US); Marcel P. Bruchez, Belmont, CA (US); Joseph A. Treadway, Fremont, CA (US); Jonathan P. Earhart, Castro Valley, CA (US)

(73) Assignee: Invitrogen Corporation, Carlsbad, CA (US)

(*) Notice: Subject to any disclaimer, the term of this patent is extended or adjusted under 35 U.S.C. 154(b) by 387 days.

This patent is subject to a terminal disclaimer.

(21) Appl. No.: 10/726,716

(22) Filed: Dec. 2, 2003

(65) Prior Publication Data

US 2004/0247517 A1   Dec. 9, 2004

Related U.S. Application Data

(63) Continuation of application No. 10/032,809, filed on Dec. 26, 2001, now Pat. No. 6,682,596, which is a continuation-in-part of application No. 09/751,670, filed on Dec. 28, 2000, now abandoned.

(51) Int. Cl.
   *C30B 29/40* (2006.01)

(52) U.S. Cl. .................... 117/68; 117/69; 117/200; 117/956; 117/959; 117/957

(58) Field of Classification Search ............... 117/68, 117/69, 200, 956, 959, 957
See application file for complete search history.

(56) References Cited

U.S. PATENT DOCUMENTS

| | | |
|---|---|---|
| 5,747,180 A | 5/1998 | Miller et al. |
| 6,179,912 B1 | 1/2001 | Barbera-Guillem et al. |
| 6,221,602 B1 | 4/2001 | Barbera-Guillem et al. |
| 6,225,198 B1 | 5/2001 | Alivisatos et al. |
| 6,268,041 B1 | 7/2001 | Goldstein |
| 6,333,110 B1 | 12/2001 | Barbera-Guillem |
| 6,682,596 B1 * | 1/2004 | Zehnder et al. ............... 117/68 |

\* cited by examiner

*Primary Examiner*—Robert Kunemund
(74) *Attorney, Agent, or Firm*—Pepper Hamilton, LLP

(57) ABSTRACT

Nanocrystals are synthesized with a high degree of control over reaction conditions and hence product quality in a flow-through reactor in which the reaction conditions are maintained by on-line detection of characteristic properties of the product and by adjusting the reaction conditions accordingly. The coating of nanocrystals is achieved in an analogous manner.

26 Claims, 5 Drawing Sheets

US 7,144,458 B2

FLOW SYNTHESIS OF QUANTUM DOT NANOCRYSTALS

CROSS REFERENCE TO RELATED APPLICATION

This application is a continuation of co-pending United States patent application Ser. No. 10/032,809, filed Dec. 26, 2001, now U.S. Pat. No. 6,682,596, which is a continuation-in-part of then co-pending U.S. patent application Ser. No. 09/751,670, filed Dec. 28, 2000, abandoned, the contents of which are incorporated herein by reference in their entirety.

BACKGROUND OF THE INVENTION

1. Field of the Invention

This invention resides in the field of nanocrystalline materials and processes for their manufacture.

2. Description of the Prior Art

Quantum-sized particles, i.e., those having diameters within the range of about 0.1 nm to about 50 nm, also known as quantum dots or nanocrystals, are known for the unique properties that they possess as a result of both their small size and their high surface area. Some of these particles have unique magnetic properties that make the particles useful in ferro fluids, in magnetic tagging elements, and in electronic data systems such as recording media. Luminescent nanocrystals are particularly useful as detectable labels such as oligonucleotide tags, tissue imaging stains, protein expression probes, and the like, in applications such as the detection of biological compounds both in vitro and in vivo. Luminescent nanocrystals offer several advantages over conventional fluorophores, particularly for multiplexed and/or high sensitivity labeling. Nanocrystals typically have larger absorption cross sections than comparable organic dyes, higher quantum yields, better chemical and photochemical stability, narrower and more symmetric emission spectra, and a larger Stokes shift. Furthermore, the absorption and emission properties vary with the particle size and can be systematically tailored.

A variety of methods have been reported for the preparation of nanocrystals. These methods include inverse micelle preparations, arrested precipitation, aerosol processes, and sol-gel processes. A method commonly used for the preparation of binary nanocrystals is one in which an organometallic and elemental set of nanocrystal precursors is injected into a hot solvent as the solvent is being stirred. Product nucleation can begin immediately, but the injection causes a drop in the solvent temperature, which tends to halt the nucleation process. Nucleation and particle growth can be continued by heating the reaction mixture with further stirring, and the temperature can be dropped to stop the reaction when the desired particle size is obtained. As a result, the success of this batchwise "stirred-pot" method is strongly affected by system parameters such as the initial temperature of the solvent, the injection temperature and in particular the injection rate, the stirring efficiency, the concentrations of the reactant materials, the length of time that the mixture is held at the reaction temperature, and the efficiency of the cooling both after injection and after the desired endpoint is achieved. Some of these parameters are difficult to control with precision, and this can lead to poor reproducibility of the product. The lack of precise control also leads to nanocrystals with surfaces that are nonuniform, products that are readily degradable, and/or nanocrystals with low emission quantum yields.

The initial reaction conditions, i.e., the manner and conditions under which the reaction is initiated, are particularly important in controlling the quality and uniformity of the product, far more so than in other types of synthesis. Stirred-pot methods suffer in this regard since there are limits to how rapidly and uniformly the temperature of the reaction mixture can be changed or otherwise controlled. The temperature drop that occurs upon injection of the precursors will vary with the precursor temperature prior to injection, the volume of precursor injected and its rate of injection, the volume of the heated solvent, and the stirring efficiency. The difficulty in cooling rapidly when terminating the reaction often means that a lower reaction temperature must be used as a means of avoiding excess reaction. Further difficulties with stirred-pot methods are that they often involve the injection of large volumes of flammable or pyrophoric materials at very high temperatures, or the rapid evolution of gases, all of which present safety hazards.

Control of the properties of nanocrystals by the application of coatings or shells has been reported, notably in International Patent Publication No. WO 99/26299 (PCT/US98/23984), "Highly Luminescent Color-Selective Materials," Massachusetts Institute of Technology, applicant, international publication date 27 May 1999, and references cited therein. The application of an inorganic shell, for example, can increase the quantum yield of the nanocrystal as well its chemical stability and photostability. The techniques for applying a shell are stirred-pot techniques that are usually similar to those used for the preparation of the core. Like the diameter of the core, the thickness of the shell affects the properties of the finished product, and the thickness will vary with the same system parameters that affect the core. The difficulties in controlling these parameters in a stirred-pot system lead to difficulties in controlling the nature and quality of the final product.

SUMMARY OF THE INVENTION

The limitations and difficulties described above and others encountered in the preparation of nanocrystals are addressed by the present invention, which resides in processes and apparatus for the production of monodisperse luminescent semiconductor nanocrystals, for the application of a coating to nanocrystal cores, and for both. The manufacture of nanocrystals in accordance with this invention is accomplished by first dissolving or dispersing precursor materials capable of reacting to form nanocrystals in a solvent, for example a coordinating solvent, and introducing the resulting reaction mixture into a reaction tube that is embedded or immersed in a heat transfer medium. Likewise, the application of a coating to nanocrystal cores in accordance with this invention is accomplished by dispersing the nanocrystal cores in a solvent, for example a coordinating solvent, in which are dissolved the precursor materials for the coating, and introducing this reaction mixture into the reaction tube. In either case, the heat transfer medium maintains the reaction mixture at the desired reaction temperature, and the reaction mixture is passed continuously through the tube. The internal diameter of the tube is preferably small enough to promote rapid transfer of heat from the tube walls to the center of the fluid stream flowing through the tube and hence rapid heating of the continuously flowing stream to the reaction temperature. In addition to the tube diameter, the flow rate is varied and adjusted, and the tube length selected, to permit control of the reaction. Flow rate, temperature and pressure are all controllable, and in preferred embodiments the reaction is quenched by cooling the product stream upon its emergence from the reaction tube by any of various conventional cooling techniques.

Characteristic properties of the product stream, such as optical properties, electrical properties, magnetic properties, electromagnetic properties, and the like are detected and a comparison is made between the detected values and a predetermined or preselected target range that is indicative of the product quality sought to be achieved. Any discrepancy or deviation between the detected values and target range can then be used to adjust the variable reaction conditions, such as the temperature of the heat transfer medium, the flow rate of the reaction mixture through the tube, or both, until the product changes sufficiently that the detected values fall within or otherwise conform to the target range.

It has further been discovered that the final nanoparticle size, size distribution and yield can be controlled by introducing a reaction promoter into the reaction system under selected conditions such as exposure time and temperature. An example of a reaction promoter is air or generally any oxygen-containing gas (i.e., oxygen gas itself or a gas mixture containing molecular oxygen). The particle size, size distribution and yield affect the properties of the product stream listed above, i.e., the optical, electrical, magnetic, and electromagnetic properties, and deviations between the detected values and the target range can be reduced or eliminated by adjustment of the exposure time to the oxygen-containing gas, the temperature maintained during the exposure, or other characteristics of the exposure that can be varied. Exposure of the reaction mixture to the gas can be done before the reaction mixture enters the continuous-flow system or while the reaction mixture is in the continuous-flow system.

Reaction apparatus in accordance with this invention includes a thermally conductive reaction tube of sufficiently small internal diameter to accomplish effective heat transfer in the flowing stream, a heat transfer medium in thermal contact with the exterior of the reaction tube, a pump or other fluid-driving component for continuously supplying pressure to a reactant or precursor mixture to the reaction tube, a monitoring unit to evaluate, measure, or otherwise detect the properties of the product stream, preferably but not necessarily as the product stream leaves the reaction tube, as an indication of the nature and quality of the nanocrystals formed in the reaction mixture during its passage through the reaction tube, and optionally a control loop to adjust the reaction conditions in the tube or upstream of the tube to correct for any discrepances between the detected values and the target range.

Further details of these features and the various preferred embodiments of the several aspects of this invention are described below.

DETAILED DESCRIPTION OF THE INVENTION AND SPECIFIC EMBODIMENTS

Figure 1:
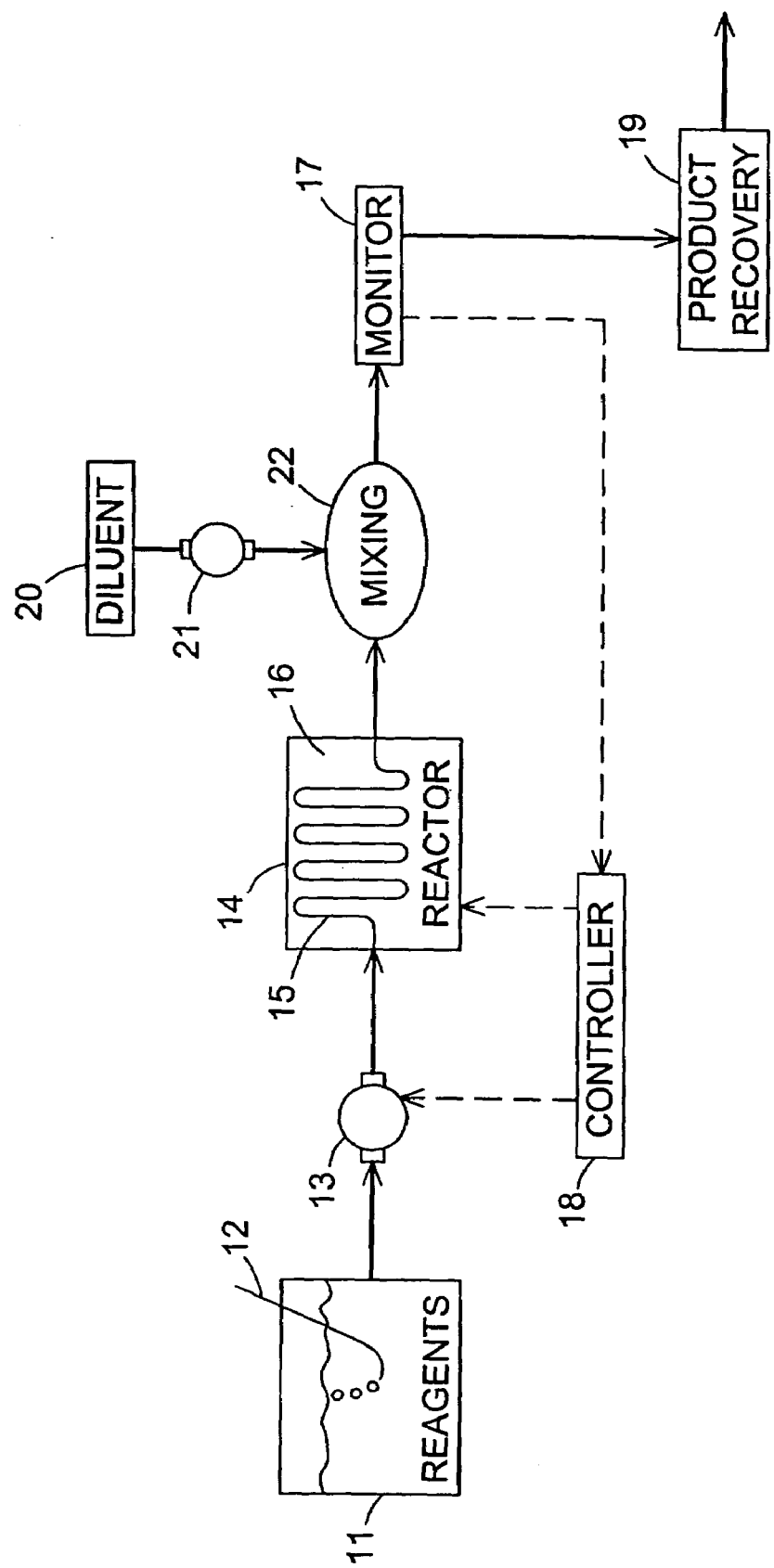
FIG. 1 is a process flow diagram of one embodiment of the present invention.

The terms "semiconductor nanocrystal," "quantum dot," "Qdot™ nanocrystal," or simply "nanocrystal" are used interchangeably herein and refer to an inorganic crystallite between about 1 nm and about 1000 nm in diameter, more typically between about 2 nm and about 20 nm (such as 2, 3, 4, 5, 6, 7, 8, 9, 10, 11, 12, 13, 14, 15, 16, 17, 18, 19, or 20 nm). A semiconductor nanocrystal is capable of emitting electromagnetic radiation upon excitation (i.e., the semiconductor nanocrystal is luminescent) and includes a "core" of one or more first semiconductor materials, and may be surrounded by a "shell" of a second semiconductor material, according to terminology used in the art. A semiconductor nanocrystal core surrounded by a semiconductor shell is referred to as a "core/shell" semiconductor nanocrystal. The surrounding "shell" material typically has a bandgap energy that is larger than the bandgap energy of the core material and can be chosen to have an atomic spacing close to that of the "core" substrate. The core and/or shell can be a semiconductor material including, but not limited to, those of the Groups II–VI (ZnS, ZnSe, ZnTe, CdS, CdSe, CdTe, HgS, HgSe, HgTe, MgS, MgSe, MgTe, CaS, CaSe, CaTe, SrS, SrSe, SrTe, BaS, BaSe, BaTe, and the like) and III–V (GaN, GaP, GaAs, GaSb, InN, InP, InAs, InSb, and the like) and IV (Ge, Si, and the like), and alloys or mixtures thereof.

The term "luminescence" denotes the emission of electromagnetic radiation (light) from an object. Luminescence results from a system that is "relaxing" from an excited state to a lower state with a corresponding release of energy in the form of a photon. These states can be electronic, vibronic, rotational, or any combination of these three. The transition responsible for luminescence can be stimulated through the release of energy stored in the system chemically or added to the system from an external source. The external source of energy can be of a variety of types including chemical, thermal, electrical, magnetic, electromagnetic, physical, or any other type excited by absorbing a photon of light, by being placed in an electric field, or through a chemical oxidation-reduction reaction. The energy of the photons emitted during luminescence can be in a range of low-energy microwave radiation to high-energy x-ray radiation. Luminescence typically entails the release of photons in the range of from IR to UV radiation.

The term "monodisperse" when describing particles denotes a population of particles of which a major portion, typically at least about 60%, more preferably from 75% to 90%, fall within a specified particle size range. A population of monodisperse particles deviates less than 10% rms (root-mean-square) in diameter and typically less than 5% rms. In addition, upon exposure to a primary light source, a monodisperse population of semiconductor nanocrystals is capable of emitting energy in narrow spectral linewidths, as narrow as 12 nm to 60 nm full width of emissions at half maximum peak height (FWHM), and with a symmetric, nearly Gaussian line shape. As one of ordinary skill in the art will recognize, the linewidths are dependent on, among other things, the size heterogeneity, i.e., monodispersity, of the semiconductor nanocrystals in each preparation. Certain single semiconductor nanocrystal complexes have been observed to have FWHM as narrow as 12 nm to 15 nm.

The formation of nanocrystalline particles (or nanocrystal cores for encapsulation) in accordance with this invention is done in a continuous-flow manner, and precursors known in the art may be used. Useful precursors are many and varied, depending on the type of nanocrystals to be prepared and the intended use of the nanocrystals. Among the various classes of nanocrystals are those that emit light, and examples are those bearing the empirical formulae CdX or ZnX in which X is a chalcogen. Preferred chalcogens are S, Se and Te, with Se particularly preferred. Preferred nanocrystals are ZnS, ZnSe, ZnTe, CdS, CdSe, and CdTe. Reactants capable of forming nanocrystals of these materials are cadmium and zinc salts, cadmium and zinc oxides, and organocadmium and organozinc compounds as the source of the Cd and Zn, respectively, and elemental chalcogen or chalcogen-containing compounds as the source of the chalcogen. Examples of cadmium and zinc salts are those in which the anion is acetate or other carboxylates (such as formate, decanoate, and alkanoates of intermediate chain lengths, as well as oxalate, maleonate, and adipate), acetylacetonate, nitrates, nitrites, sulfates, sulfites, perchlorates, chlorates, carbonate, carbamate, phosphates (including substituted phosphates and particularly hexafluorophosphates), fluoride, chloride, bromide, iodide, hydroxide, and borates (including substituted borates such as tetrafluoroborate). Preferred salts are acetates, carboxylates, acetylacetonates, perchlorates, carbonates, chlorides, bromides, iodides, hydroxides, and unsubstituted borates. While dimethyl cadmium is an example of an organocadmium compound. Examples of organocadmium and organozinc compounds are those in which the organic moiety is methyl (such as dimethylcadmium), ethyl (such as diethyl zinc), butyl, phenyl, and combinations of these moieties.

The coating of pre-formed nanocrystal cores in accordance with this invention is likewise performed in a continuous-flow manner by placing the cores in a suspension in which the precursors that form the coating are dissolved. Coatings of various compositions known in the art can be applied in this manner. One class of coatings are those serving to passivate the core surfaces to improve optical properties such as quantum yield, and the precursors for these coatings are surface passivating reactants. Among this class are nanocrystals bearing the empirical formula ZnY in which Y is S, Se, Te, or a mixture thereof. The passivating reactants for this class include a Zn-containing reagent and a reactant containing either S, Se, Te or combinations thereof.

Whether the reaction is a nanocrystal core-forming reaction or a coating reaction, the process is often facilitated by performing the reaction in the presence of a coordinating solvent or by addition of a coordinating additive. The terms "coordinating solvent" and "coordinating additive" as used herein denote a solvent or other chemical additive that enters into molecular coordination with the atoms in the reactants that combine to form the nanocrystalline materials or the reactants that combine to form the coatings on the nanocrystal core surfaces or with the nanocrystals themselves. The coordinating solvent thus enhances the solubility of the reactants while also serving as a means of modulating the reactivity of the precursors or the growing nanoparticles. A wide range of solvents that function in this manner can be used, and preferred among these are alkyl phosphines, alkyl phosphine oxides, pyridines, furans, ethers, amines and alcohols. Coordinating solvents that are particularly preferred for cadmium chalcogenide nanocrystals are tri-n-octylphosphine and tri-n-octylphosphine oxide. A coordinating solvent that is particularly preferred for zinc chalcogenide nanocrystals is hexadecylamine. In certain embodiments of the invention, notably Cd-Se systems, a mixture of tri-n-octylphosphine and tri-n-octylphosphine oxide offers particular benefits, the former potentially serving as a preferential coordinator for Se and the latter for Cd.

The reactions performed in accordance with this invention are performed on a continuous-flow basis in the thermally conductive reaction tube. The tube is thermally conductive in order to permit efficient heat transfer between the heat transfer medium surrounding the tube and the reaction mixture flowing through the tube. As will be well appreciated by those skilled in the art, the efficiency of the heat transfer is also dependent on the internal diameter and wall thickness of the tube and on the composition of the heat transfer medium surrounding the tube. As an alternative, the reactants can be preheated outside the reaction tube and combined immediately prior to entry into the tube.

While this invention is not intended to be limited to specific values for the diameter and length of the tube, the optimal values of these dimensions will be determined by considerations of the viscosity of the reaction mixture and the pressure drop needed to drive the reaction mixture through the tube, both of which will depend on the concentration of the reactants in the reaction mixture, the temperature, and other parameters. The optimal dimensions can be determined by routine experimentation, or by the use of relationships that are well known among those skilled in fluid dynamics. In general, however, successful results will be obtained with a reaction tube having an internal diameter of about 1.0 mm or less, and preferably within the range of about 0.1 mm to about 1.0 mm, and most preferably within the range of from about 0.25 mm to about 0.8 mm. The reaction tube will have a wall thickness great enough to provide dimensional stability and sturdiness to the tube but the wall may otherwise be as thin as possible. If the tube material has a high heat conductivity, the tube will permit rapid heat transfer and the choice of wall thickness will be of little importance. In some cases, such as a tube embedded in a solid temperature control block, the reaction tube may be continuous with the block, whereupon wall thickness of the tube itself is not a consideration.

Any temperature changes that are imposed on the reaction mixture during its passage through the reaction tube will likewise depend on the tube diameter and on the flow rate of the reaction mixture. Flow rates may vary, and the invention is not intended to be limited to specific flow rates. Effective results will be achieved however at flow rates within the range of from about 10 µL per minute to about 1000 µL per minute, preferably from about 30 µL per minute to about 300 µL per minute. In certain embodiments of the invention, faster flow rates can be used.

The degree or extent of reaction also depends on the concentrations of the reactants, the length of the reaction tube, and the temperature and pressure of the reaction mixture inside the tube. As noted above, the temperature may be imposed by a heat transfer medium surrounding the tube itself or by preheating the reactants prior to their entry into the tube. None of these operating parameters are limited to specific values in this invention, and each may vary considerably in accordance with the type of product being prepared and the characteristics and qualities that are sought in the product. The appropriate selection of these parameters is a matter of routine skill to those experienced or familiar with batchwise processes for these reactions. The choice of the tube dimensions, for example, will depend on the desired flow rate and temperature as well as other parameters of the system. In most applications, it is contemplated that the reaction tube will be from about 3 cm to about 300 cm in length, preferably from about 10 cm to about 100 cm in length. Likewise, the most typical temperatures will be at least about 100° C., and preferably within the range of from about 100° C. to about 400° C., more preferably within the range of about 250° C. to about 400° C. These temperature ranges are applicable to both the nanocrystal core-forming reaction and the coating reaction.

As noted above, additional control of the reaction can be achieved by the introduction of a reaction promoter to the reaction system. This is preferably done prior to the start of the nanoparticle nucleation reaction. Control of the reactivity by use of a reaction promoter such as air or an oxygen-containing gas in general serves as a means of controlling the number of nanoparticle nuclei formed in a given period of time. This results in greater predictability and control of the final nanoparticle size, size distribution and yield. Controlling the reactivity can also serve as a means of controlling the particle growth rate once nucleation has occurred. Control of the growth rate is useful in focusing the size of the particles, and thereby producing a population of nanoparticles having a very narrow size distribution.

The reaction promoter can either be added or produced in situ to control the nucleation process, the growth process, or both. A preferred method is the controlled addition of air to the reactants. Exposure to air can be achieved in such a way that any combustion hazard is reduced or eliminated. The beneficial effects of the use of the reaction promoter are achievable on any of the nanoparticle-forming and nanoparticle-coating reaction systems and reactants listed above.

In the fast kinetic growth regime, nanoparticles will grow rapidly when the concentration of monomers is high relative to the number of particles. Such growth is accompanied by narrowing of the particle size distribution. As long as this condition exists, the particle size distribution remains narrowly focused. When the monomer concentration is reduced to a level that cannot maintain the optimum growth rate, statistical broadening of size distributions generally occurs. Optimally, the reaction should be quenched prior to the occurrence of such defocusing so as to ensure a narrow particle size distribution.

By controlling precursor reactivity in accordance with the present invention, the particle size at which the broadening of the size distribution occurs can be controlled and the reaction can be arrested before broadening occurs. This can be accomplished by controlling the number of nuclei formed. Larger particles are obtained by controlling the initial reactivity to make fewer nuclei, and smaller particles are obtained by increasing reactivity to make more nuclei. In both cases, the reaction can be arrested at the point where the growth rate begins to decrease due to monomer depletion. The maximum practical yield for the chosen particle size is thus achieved without sacrificing narrow particle size distribution.

Although this invention is not intended to be bound by any particular theory, there are several possible means by which the reaction promoting additives might achieve its effect on particle size, distribution, and yield. For example, when molecular oxygen is present, the initial nuclei in the core reaction may be CdO (or Cd(OH)$_2$) rather than CdSe. These nuclei may form more easily than the CdSe nuclei for a variety of reasons including but not limited to differences in driving force or activation, or a differential sequestration of precursors. These nuclei would provide a growth site for CdSe. During the process, the oxygen atoms might be annealed out or remain at the core of the final material. Another possibility is that an impurity, most likely from a solvent such as tri-n-octylphosphine (whose use is discussed below), may exist in the reaction system. Impurities may hinder the growth of particles through sequestration or redox reactivity. Oxygen added to the reaction system may deactivate or remove the impurity and thereby indirectly facilitate the reaction. Further possibilities involve redox reactivity. In the preparation of cadmium nanocrystals from salt feedstocks or by in situ reaction such as an acid-base reaction, two reducing equivalents are required per cadmium equivalent. Oxygen may facilitate these redox reactions directly or indirectly through the formation of intermediates.

Increases in the rates of nucleation and growth are advantageous to the continuous-flow synthesis of nanoparticles, since the synthesis is optimally performed on a short time scale, i.e., a residence time in the reaction tube of at most a few minutes. With greater control over the nucleation and growth rates, particles of optimal properties can more easily be produced in the reaction tube. The improved control provided by a reaction promoter can compensate for any broadening of the size distribution that might be caused by non-uniformities in the temperature of the flowing reactant stream. The yield increase produced by a reaction promoter is also advantageous for scale-up since it lessens the need to change the flow rate, tube diameter, or tube length.

The reaction tube itself may be of any configuration that will permit continuous flow and that can be immersed, embedded or otherwise placed in full thermal contact with a heat transfer medium. The tube can assume any configuration, including straight, serpentine, or coiled. The tube can be made of a variety of materials that can be selected on the basis of their thermal conductivity, flexibility, or chemical reactivity. The tube can also be of composite construction, such as glass-coated stainless steel, to obtain particular combinations of properties. The heat transfer medium can be gas, liquid, or solid. With gas or liquid media, circulation can improve the heat transfer efficiency by creating a more uniform temperature. A solid heat transfer medium can be formed by casting or molding a heat conductive material around the reaction tube with an electrical heater embedded in the casting or molding. If desired, the reaction tube can be formed by forming a bore through a solid block of heat transfer medium, the bore itself serving as the tube. An effective arrangement is the use of a reaction tube with a block of heat conductive metal cast around the tube. Materials of construction that are chemically inert to the reaction materials while providing effective heat transfer will generally be used.

Monitoring of the product stream is performed by conventional apparatus for the on-line detection of the determinative or characteristic properties of the product stream. Examples of these properties are absorbance of electromagnetic radiation, emission of electromagnetic radiation, both absorbance and emission of electromagnetic radiation, static or dynamic light scattering, refractive index, conductance, and magnetic susceptibility. Static light scattering, dynamic light scattering, or refractive index, for example, can be used to assess the size distribution of the particles. Conductance can be used with charged particles to obtain a particle count, and magnetic susceptibility can be used with magnetic or paramagnetic particles to determine the size distribution, particle count, or both. All of these properties can be detected by techniques that are known in the art using instrumentation that is commercially available. In the preferred practice of the invention, the properties detected are optical properties such as, for example, emission intensity, emission wavelength, full width at half maximum peak height (FWHM), absorption, light scattering, fluorescence lifetime, or combinations of these properties. Detection can be performed at a site downstream of the reaction tube and heat transfer medium. Alternatively, detection can be performed on-line within the reaction tube itself, in which case a tube that permits such detection is used. For detection of optical properties, for example, suitable tubes are those that are optically transparent. In preferred implementations of this invention, the product mixture is cooled at or near the site where detection is performed. Thus, when on-line detection is performed, the product mixture is preferably cooled as it emerges from the heat transfer medium but before it reaches the on-line detection point. Cooling in these embodiments is done to lower the temperature of the product stream enough to substantially quench any reaction still occurring in the moving stream and to standardize the detection temperature, thereby eliminating variations in the optical properties due to temperature. Cooling can be accomplished by passing the product stream through a cooling tube, or a downstream section of the reaction tube, embedded or immersed in a cooling medium in a manner analogous to the heat transfer medium used to heat the starting materials to reaction temperature. It is often sufficient to cool the material passively by simply removing the heating element at the end of the reaction zone. Alternatively, cooling can be achieved by diluting the product stream with additional solvent at an appropriately low temperature. In certain embodiments the injection of additional solvent provides an additional benefit—i.e., when the solvent in which the reaction takes place is a mixture of species such as tri-n-octylphosphine and tri-n-octylphosphine oxide, one of which has a melting point above room temperature, the addition of a further amount of a lower-melting solvent species for cooling purposes can prevent freezing of the higher-melting species and facilitate handling of the product stream.

The properties that are monitored may be any detectable properties that serve as an indication of the size, size distribution, or yield of the nanocrystals, the thickness of the coating, the surface characteristics, or in general the degree or quality of reaction that has occurred in the reaction tube. Absorbance is readily measured by irradiating the product stream with light and determining the absorption spectra. Light scattering is readily measured by illuminating the product stream and detecting the direction or amount of scattered light, either one being characteristic of the properties of the nanocrystals and their chemical composition. Photoluminescence is readily measured by irradiating the product stream with light of an appropriate wavelength to excite the nanoparticles and detecting the emission spectra resulting from the excitation. Conventional spectrophotometers or other light detecting devices can be used.

Comparison of the spectra with a target range is then performed to determine whether adjustments are needed to the reaction conditions to shift the spectra into the target range. If the shift can be achieved by a change in the reaction temperature, the comparison can serve as a means of determining how much and in which direction to modify the temperature of the heat transfer medium and hence the temperature in the reaction tube. The comparison can be performed visually in a trial run or at the start of the process or at any time during the progress of the reaction, and adjustments to the temperature can be made manually by the operator. Alternatively, the comparison can be performed by automated instrumentation, and if desired, on a continuous basis, with a corresponding adjustment in temperature or flow rate until the comparison produces a favorable result.

Figure 2:
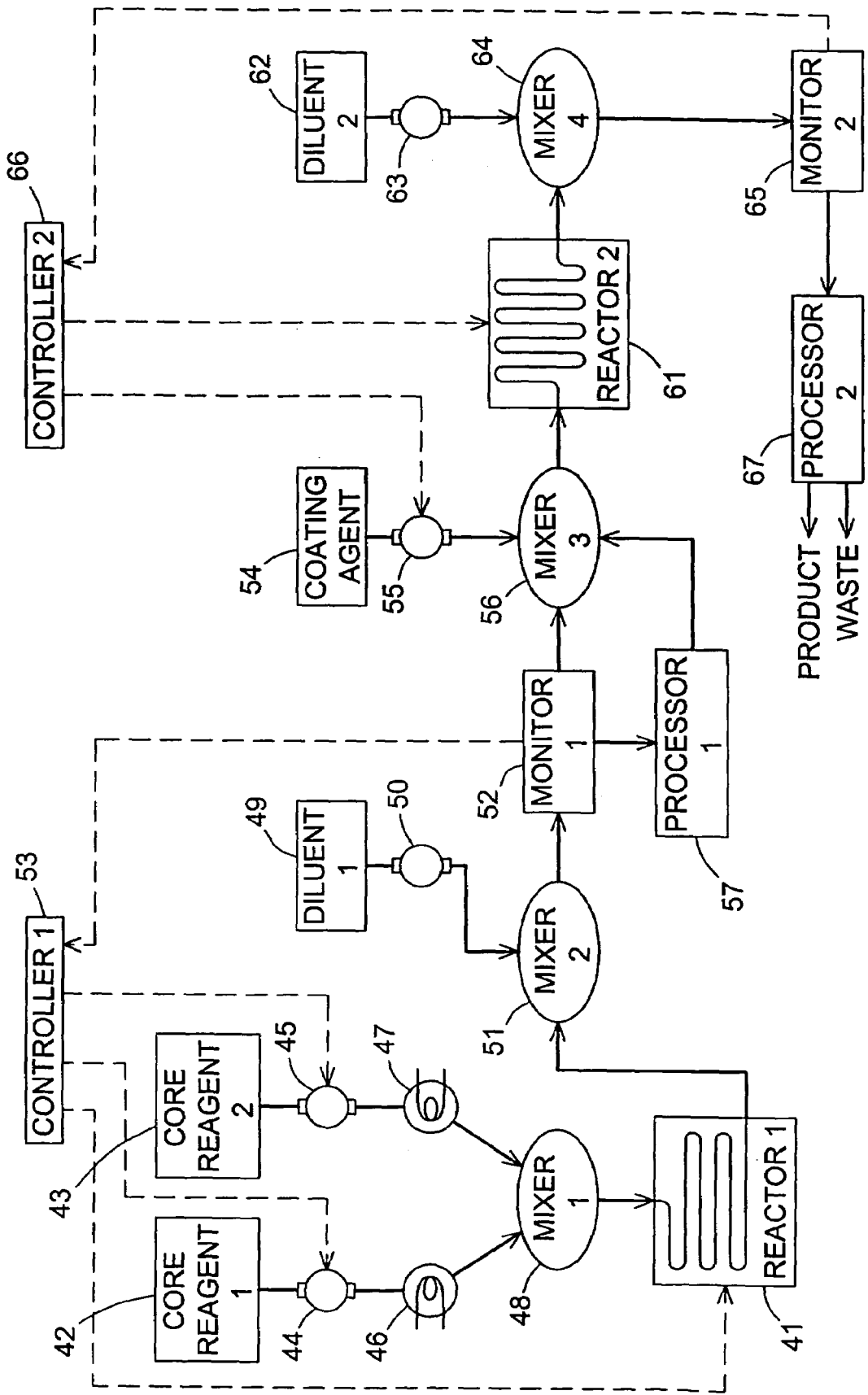
FIG. 2 is a process flow diagram of a second embodiment of the present invention.

FIGS. 1 and 2 attached hereto illustrate various embodiments of the invention in the form of process flow diagrams.

FIG. 1 is a process flow diagram illustrating one example of a rudimentary system embodying the principles of this invention. The first stage is a reagent preparation stage 11 in which nanocrystal precursors (for those embodiments involving the formation of nanocrystal cores) are dissolved in a coordinating solvent, or in which preformed nanocrystal cores (for those embodiments involving the coating of the preformed cores) are suspended in a solution of coating precursors dissolved in a coordinating solvent. In those embodiments of the invention in which air or any other reaction promoter is contacted with the reactants prior to their entry into the reaction tube, the air 12 is fed to the solution or suspension under controlled conditions of exposure time and temperature. In either case, the resulting reaction mixture is transferred by a computer-controlled metering pump 13 (syringe or gear pump) to the heated reactor 14, which consists of a stainless steel tube 15 whose inner diameter is 0.01 inch to 0.03 inch (0.25 mm to 0.76 mm) around which a zinc block 16 has been cast. The zinc block is provided with temperature detection and heating connections that permit temperature control of the block 16 (and hence the tube 15) to various temperatures up to about 400° C. At the outlet of the heated reactor 14, the product stream passes through a flow-through monitoring cell 17 which includes an ultraviolet light source to excite the nanocrystals in the product stream and a CCD-based miniature spectrometer to measure the emission spectra from the nanocrystals. The emission spectra can be monitored visually by the operator and adjustments made to the temperature of the heated reactor 14, the metering pump 13, or both, to achieve nanocrystals that emit the desired spectra. Alternatively, the emission spectra detected by the monitor can be transmitted to an automated controller 18 which will process the data, compare it to a target spectrum, and transmit signals to either the heated reactor, the metering pump, or both, to correct the temperature and/or flow conditions. This can be done on a continuous basis until the detected spectra conform to the target spectra to a degree that is acceptable to the operator. The finished nanocrystals are collected in a product recovery unit 19 when the parameters have been adjusted sufficiently to achieve the desired spectral output.

An optional added feature in FIG. 1 is the provision of the introduction of cooled diluent 20 to the product stream emerging from the reactor 14 for purposes of quenching the reaction prior to the product mixture reaching the monitoring cell. The diluent 20 is fed through a metering pump 21 to an on-line mixing chamber 22 where it mixes with the product stream. Although not shown in the drawing, the diluent can be recovered from the product mixture, cooled and recycled to the mixing chamber.

In variations of the system illustrated in FIG. 1, two or more reagents can be supplied by individual pumping units, each under separate control from a centralized controller. As in FIG. 1, the controller signals to the pumping units can be modulated by comparisons of the spectral output of the product stream, thereby adjusting the relative feed rates of the reagents to achieve a product having the desired spectral characteristics. Likewise, monitoring cells can be placed at two or more locations along the process flow path to monitor the progress of the reaction. This will allow different reagents to be added at different stages of the process, and is particularly useful when the process is used both to form the nanocrystal core and to coat the core. The outputs of all monitoring cells will be received and processed either by individual controllers or by a common controller, and resulting signals emitted by the controller(s) can be used to drive adjustments in the temperatures or pump rates at various points along the process path. For reactions performed in two or more stages, separately controlled heating units can be used so that each stage can be individually controlled to its own optimum temperature. For systems that include monitoring cells at two or more locations, individual cooling sites can be incorporated immediately upstream of the entry to each cell. In certain systems, it may also be desirable to extract, concentrate, or isolate product from the product stream at points between successive stages of the process. Operations such as these can be performed by centrifugation, precipitation, filtration, and other similar treatments that are well known to those skilled in process chemistry.

FIG. 2 is a process flow diagram for a process that includes first preparing the nanocrystal core and then applying a coating to the core, incorporating several of the additional features of the preceding paragraph. The core is formed in a heated reactor 41 which is similar in construction to that of FIG. 1, supplied by two reagents 42, 43, each fed by individual metering pumps 44, 45, then preheated 46, 47, and combined in a mixing chamber 48 prior to entry into the reactor 41. The preheating is optional and may be used when the resulting mixture might suffer a drop in temperature due to the addition of one of the components, or when one of the solvents is a solid at room temperature. The two metering pumps 44, 45 drive the reaction mixture through the reactor 41, and the emerging dispersion of nanocrystal cores is cooled by the introduction of a cooled diluent 49, likewise supplied through a metering pump 50 and mixed with the core dispersion in a mixing chamber 51. The cooled product stream passes through a monitoring cell 52 which detects the optical properties of the nanocrystal cores in the product stream and forwards the data to a controller 53 where the data is compared to a target and corrective output signals are transmitted to the two reagent metering pumps 44, 45, and to the heating unit on the heated reactor 41.

The core suspension, upon emerging from the monitor 52, is combined with coating agent(s) to prepare for the coating reaction which, like the nanocrystal-forming reaction, occurs at an elevated temperature. The coating agent(s) 54 are supplied through a metering pump 55 and mixed with the core dispersion in a mixing chamber 56. The flow diagram presents two options for delivering the core suspension to the mixing chamber—direct delivery and delivery through a processing unit 57 where the core suspension is concentrated or otherwise treated as described above to prepare the cores for coating. In either case, the new reaction mixture enters the second heated reactor 61, which is similar in construction and principle to the first heated reactor 41. The product stream emerging from the second heated reactor contains the coated nanocrystals, and is cooled by a diluent 62 fed through a metering pump 63 and mixed with the product stream in a mixing chamber 64. The cooled coated nanocrystal stream then enters a second monitoring cell 65 which detects the optical properties of the coated cores and forwards the data to a second controller 66 where the data is compared to a target and corrective output signals are transmitted to the coating agent metering pump 55 and the heating unit on the heated reactor 61. The product stream is then processed in a processing unit 67 where the coated nanocrystals are recovered from the solvent and any unreacted material.

The following examples are offered as illustration, and are not intended to impose limits on the scope of the invention.

EXAMPLE 1

This example demonstrates the use of the present invention in preparing nanocrystals of CdSe, and the ability of an on-line fluorescence monitoring cell to differentiate between products prepared at different reaction temperatures, flow rates and the like.

A solution was prepared by dissolving 0.179 g of selenium in 16 mL of tri-n-octylphosphine (TOP) and adding 0.115 mL of dimethyl cadmium. Separately, tri-n-octylphosphine oxide (TOPO) (12.5 g) was heated under vacuum to 180° C. and then maintained at 65° C. under dry nitrogen. The heated TOPO was then combined with 7 mL of the TOP solution of selenium and dimethyl cadmium. A continuous-flow reaction was then performed, using the apparatus depicted in FIG. 1, with a reaction tube consisting of 50 cm of 0.03-inch (0.76 mm) stainless steel tubing coiled tightly and cast into a zinc block. The flow rate of the reaction mixture through the tubing was 200 μL/minute, and the zinc block was variously maintained at temperatures of 280° C., 290° C., 300° C., 310° C., 320° C., 330° C., 340° C., 350° C., and 365° C.

Figure 3:
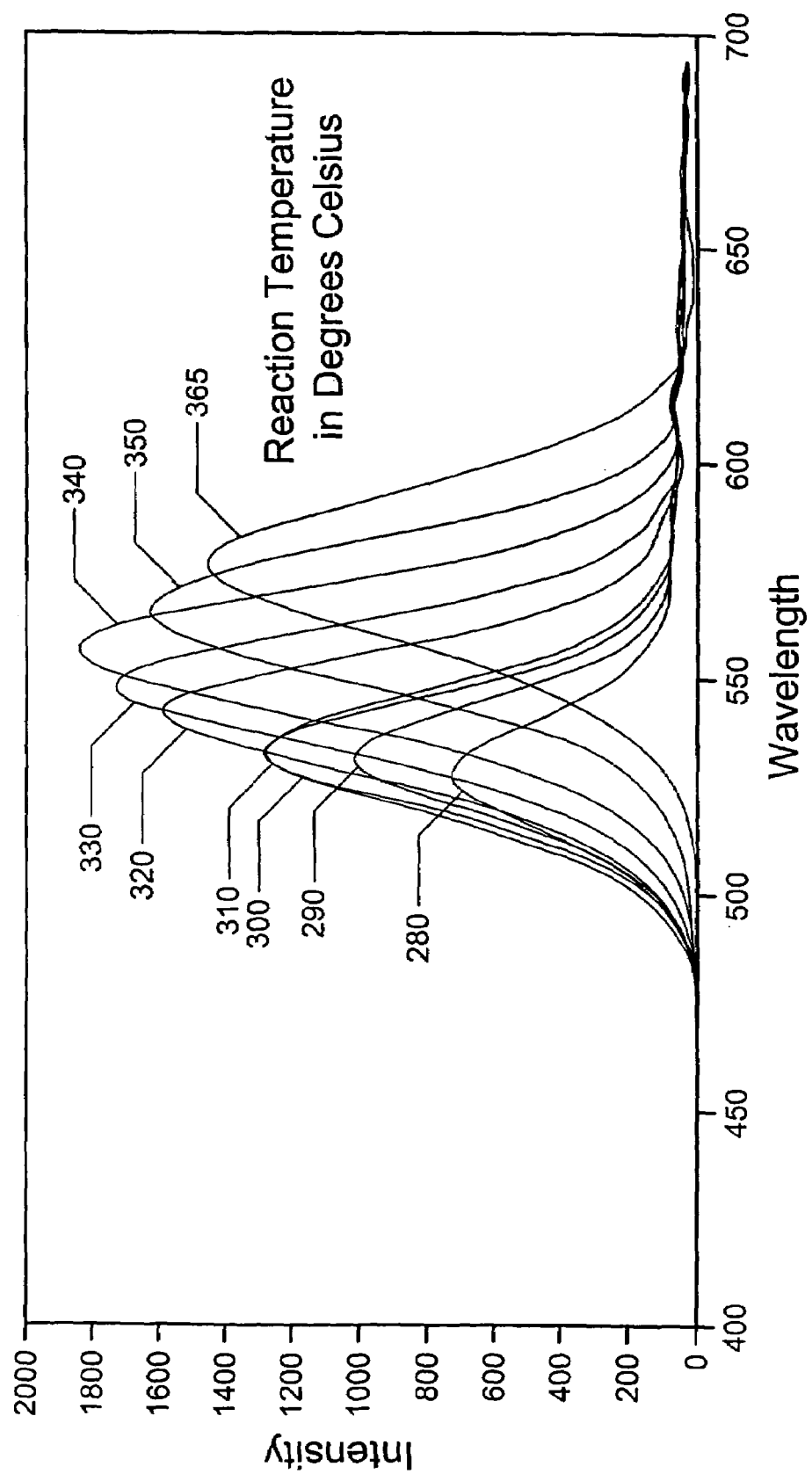
FIG. 3 is a superimposed plot of emission spectra of nanocrystals formed in accordance with the present invention under various reaction conditions.

Luminescence spectra were obtained for the emerging product formed at each of the nine reaction temperatures, and the results are shown in superimposed curves in FIG. 3. The superimposed curves show that each reaction temperature produced particles with a distinct size distribution, and that adjustment of the reaction temperature can therefore be used to obtain a product of a particular emission spectrum while still maintaining a narrow size distribution of the particles, as indicated by the peak widths.

EXAMPLE 2

Figure 4:
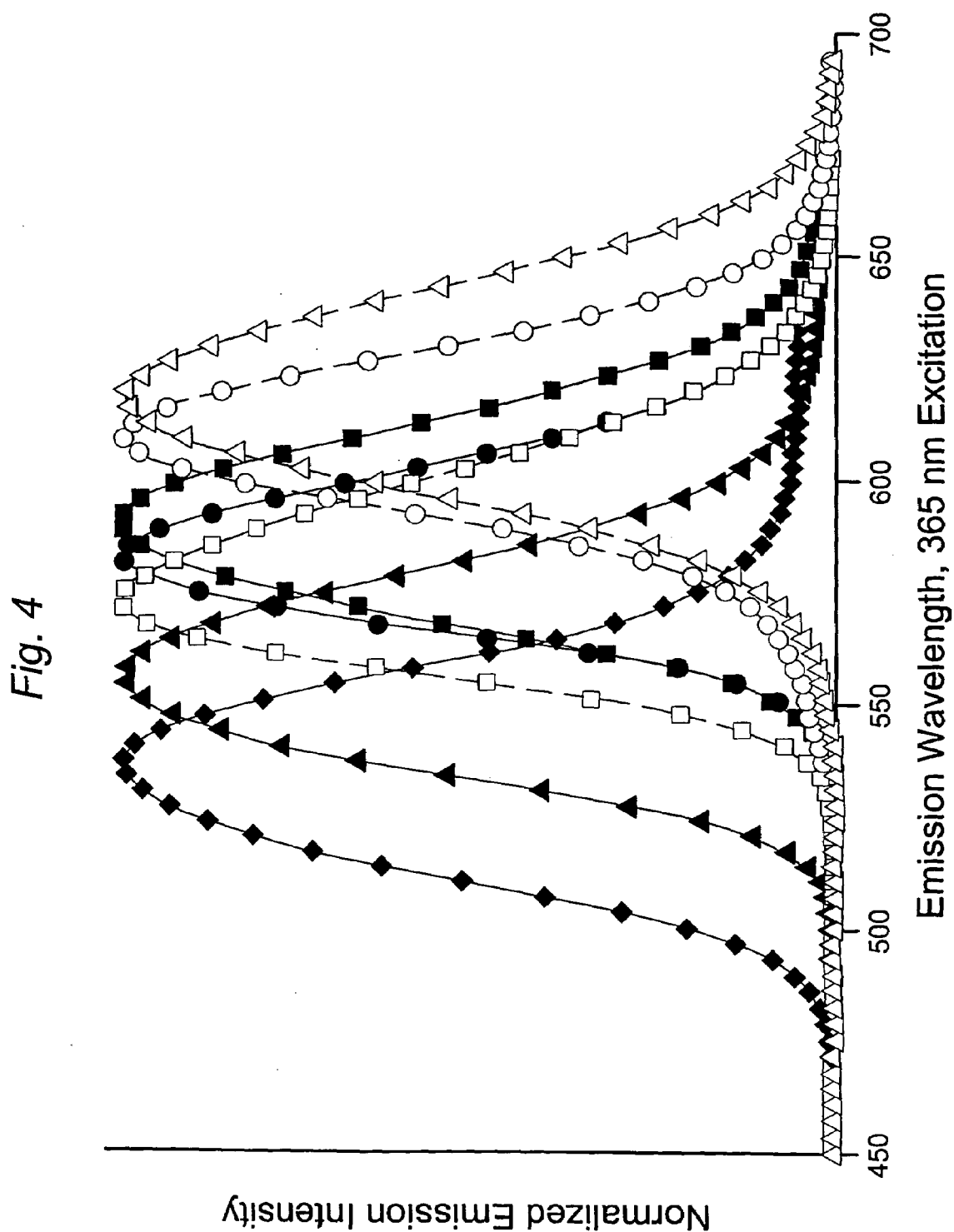
FIG. 4 is a further superimposed plot of emission spectra of nanocrystals formed in accordance with this invention under different sets of reaction conditions.

This example is a further illustration of the preparation of CdSe nanocrystals and the use of fluorescence monitoring by a process in accordance with the present invention, showing the ability of the invention to differentiate between products prepared at different reaction temperatures and flow rates. The reaction materials in this case were cadmium acetate hydrate (0.5 g) and tetradecylphosphonic acid (TDPA) (1.6 g) dissolved in 5.0 mL tri-n-octylphosphine (TOP). The resulting solution was heated at 230° C. with continuous sparging for approximately one hour. The reaction mixture was then cooled to near room temperature and combined with tri-n-octylphosphine oxide (TOPO) (10 g). This was followed by reheating of the reaction mixture under vacuum to 195° C. for an additional hour, then cooling to 60° C. A 1.0 M solution of selenium in TOP (2.7 mL) was then added via syringe. Aliquots of this final stock solution were withdrawn and passed through the same continuous flow system described in Example 1. Spectra taken at various temperatures and flow rates are shown in FIG. 4. The temperatures and flow rates used and the corresponding symbols by which they are represented in FIG. 4 are shown in Table I:

TABLE I

Legend for FIG. 4

| Temperature (° C.) | Flow Rate (μL/min) | Symbol |
|---|---|---|
| 270 | 100 | filled squares |
| 270 | 200 | filled circles |
| 270 | 400 | filled triangles |
| 270 | 800 | filled diamonds |
| 295 | 400 | open squares |

TABLE I-continued

Legend for FIG. 4

| Temperature (° C.) | Flow Rate (µL/min) | Symbol |
|---|---|---|
| 305 | 100 | open circles |
| 320 | 100 | open triangles |

As in Example 1, the superimposed curves show that each set of conditions produced particles with a distinct size distribution.

EXAMPLE 3

This example is yet a further illustration of the preparation of CdSe nanocrystals and the use of fluorescence monitoring by a process in accordance with the present invention, showing the ability of the invention to differentiate between products prepared at different flow rates.

In this example, CYANEX® 272, which is a mixture of phosphorous-containing compounds of which 87% is bis (2,4,4-trimethylpentyl)phosphinic acid (CAS Reg. No. 83411-71-6, Cytec Industries Inc., West Patterson, N.J., USA), was included as an additive to effect redox and sequestration control of the nanocrystal-forming reactions. The reaction was carried out in the same apparatus as that described in the preceding examples, with the temperature of the flow apparatus maintained at a constant 310C while flow rates of 100 µL/min and 600 µL/min were used.

Anhydrous cadmium acetate was obtained from PROCHEM (Chandler, Arizona, USA). Aside from the CYANEX® 272, all other reagents were as described in Example 2. A 0.66 M solution of cadmium acetate was prepared by combining cadmium acetate (2.28 g) with TOP (15 mL), followed by stirring for several minutes to completely dissolve the solids. A 1 M solution of selenium was similarly prepared by dissolving Se (3.16 g) in TOP (40 mL). Finally, a reaction stock solution was prepared by combining the 1 M selenium solution (0.5 mL), the 0.66 M cadmium acetate solution (1.5 mL), and TOP (8.0 mL).

Figure 5:
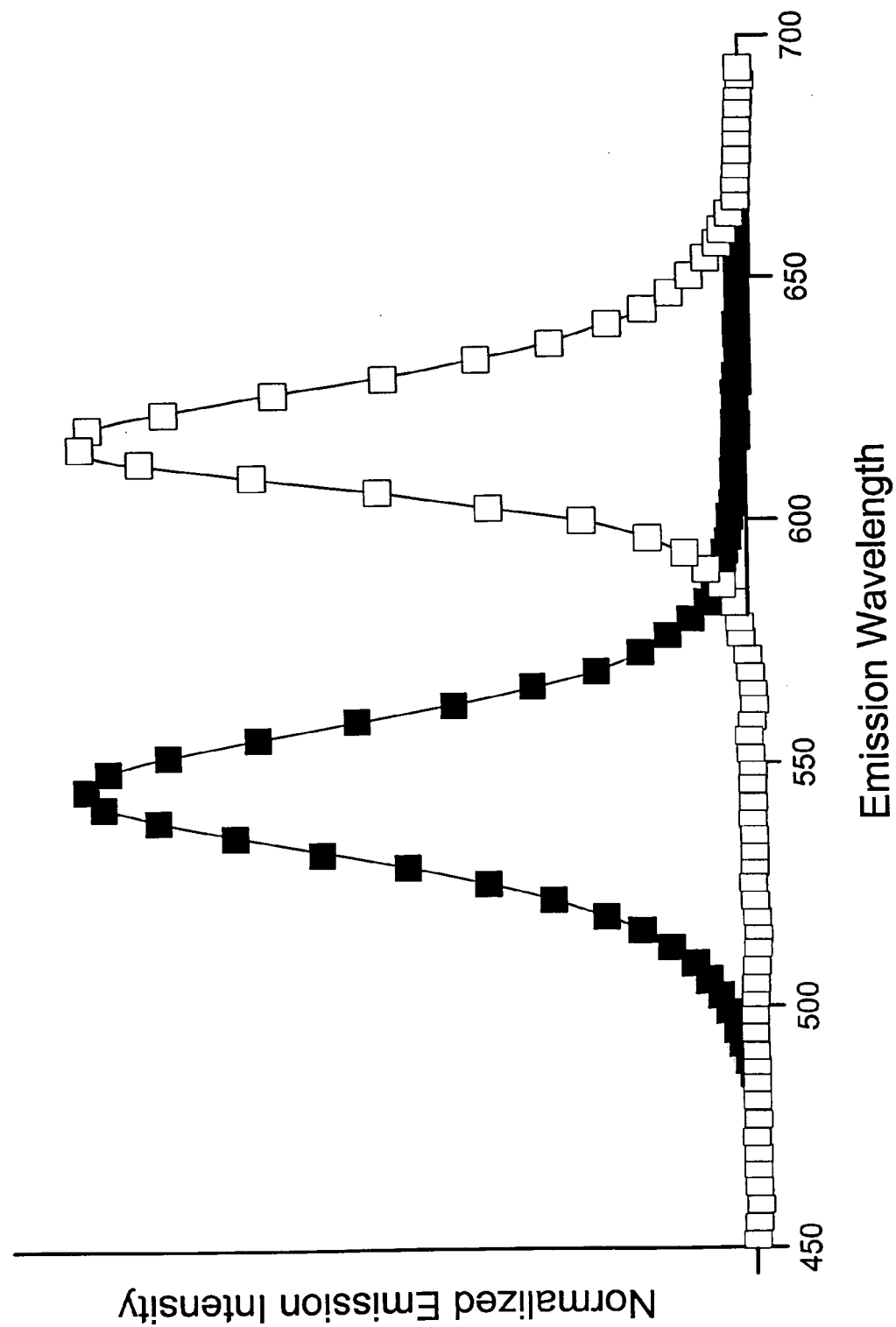
FIG. 5 is a still further superimposed plot of emission spectra of nanocrystals formed in accordance with this invention under still different reaction conditions.

A portion of the reaction stock solution (1 mL) was added to a mixture of TOPO (1 g), TOP (1 mL) and CYANEX® 272 (0.09 mL) at room temperature. A homogeneous solution was formed after a few seconds of stirring. This solution was passed through the continuous-flow reaction apparatus of the preceding examples, and emission spectra were taken. The results are shown in FIG. 5, where the filled squares represent the spectrum resulting from the reaction conditions of 310° C. and 600 µL/min, while the open squares represent the spectrum resulting from the reaction conditions of 310° C. and 100 µL/min. Here again, each set of conditions produced particles with a distinct size distribution.

EXAMPLE 4

This example illustrates the application of a passivating coating to preformed CdSe nanocrystals with fluorescence monitoring in accordance with the present invention, showing the ability of the invention to differentiate between different shell thicknesses.

A shell precursor stock solution was made by combining 12 mL TOP with 1.6 mL CYANEX® 272. Diethylzinc (172 µL) was then slowly dripped into the stock solution, and bis-trimethylsilane sulfide ((TMS)$_2$S, 349 µL) was added.

A stock of CdSe nanoparticles was prepared by first degassing tri-n-octylphosphine oxide (TOPO, 30 g) for 1 hour under vacuum at 180° C. in a three-neck round bottom flask equipped with a stir bar, bump trap and thermocouple (and temperature controller). The molten reaction mixture was then placed under a dry N$_2$ atmosphere and heated to 350° C. While an inert atmosphere was maintained, a Se solution was prepared by combining Se (360 mg) with dimethylcadmium (230 µL) in tri-n-octylphosphine (TOP, 20 mL). In a single rapid injection, the Se solution was added to the hot TOPO pot after removing the reaction mixture from the heat. Once the temperature of the reaction mixture fell to 265° C., the mixture was reheated to 290° C. The temperature was then increased at a rate of 1 deg C/h for 19 hours until the emission maximum of the particles reached 625 nm. The reaction was then quenched by cooling and adding butanol. Methanol was added to remove the largest particles by flocculation followed by filtration. The product was isolated by adding methanol to the supernatant, followed by filtration.

The nanoparticle stock prepared in the preceding paragraph had a band-edge absorbance peak at 618 nm, with an optical density (OD/cm$^{-1}$) of 40 at this wavelength. From this stock, 0.5 mL of particles was precipitated with 2 mL methanol. The pellet was resuspended with 1 mL of TOPO/dodecane (200 mg/mL), and 2.8 mL of the previously prepared shell precursor solution were added.

A continuous-flow reaction was performed within a reaction tube consisting of 50 cm of 0.02-inch (0.508-mm) ID stainless steel tubing coiled tightly and cast into a zinc block. The temperature of the block was maintained at 180° C. The reaction mixture was passed through the tube at flow rates of 50, 200, 300 and 500 µL/min, each resulting in a coating of a different thickness. A control was also included by using the same solution without heating. Luminescence spectra were obtained for the emerging product formed at each condition. Quantum yields were determined relative to rhodamine 101. The results are summarized in Table II.

TABLE II

| Luminescence Spectra Features | | |
|---|---|---|
| Flow Rate (mL/min) | Emission Peak (nm) | Quantum Yield (%) |
| Control | 627 | 11 |
| 0.05 | 638 | 21 |
| 0.20 | 634 | 38 |
| 0.30 | 632 | 37 |
| 0.50 | 629 | 35 |

These results show that control of the shell thickness, as indicated by differences in the emission wavelength, was easily modulated by the flow rate.

EXAMPLE 5

This example illustrates the controlled addition of air as a reaction promoter in the formation of CdSe nanocrystals in a continuous-flow system with fluorescence monitoring in accordance with the present invention.

Cadmium acetate hydrate (0.5 g) and tetradecylphosphonic acid (TDPA, 1.6 g) are combined with 5.0 mL TOP and the resulting solution is heated at 230° C. with continuous sparging for approximately one hour. The reaction mixture is cooled to near room temperature and combined with TOPO (10 g). The resulting reaction mixture is then reheated under vacuum to 195° C. for an additional hour, followed by cooling to 60° C. Dry air is then directed into the flask at a rate of 200 mL/min for ten minutes. The flask is then evacuated and refilled with dry nitrogen, and the procedure is repeated. A 1.0 M solution of selenium in TOP (2.7 mL) is added via syringe to form a final stock solution. Aliquots of this solution are passed through the continuous flow system used in the preceding examples.

Exposure of the reaction to air will result in the production of smaller nanoparticles and a higher particle yield. In addition, narrow particle size distributions can be obtained over a wider range of particle sizes. The particle size, yield, and distribution affect the fluorescence emission characteristics and can be monitored by continuously or intermittently detecting these characteristics. These characteristics of the particles can then be adjusted accordingly by modulating variables such as the exposure time and the exposure temperature.

The foregoing description is offered for illustrative purposes. Those skilled in the art will recognize that further modifications, variations and substitutions in the process and apparatus parameters, such as temperatures, flow rates, reactant materials and other components of the reaction and product mixtures, as well as the number and arrangement of operating units in the process flow path, can be made without departing from the spirit and scope of the invention.

What is claimed is:

1. A process for the preparation of monodisperse luminescent semiconductor nanocrystals having detectable properties within a target range, said process comprising:
   (a) combining nanocrystal-forming reactants comprising (i) a member selected from the group consisting of cadmium salts, zinc salts, cadmium oxide, zinc oxide, organocadmium compounds, and organozinc compounds and (ii) a member selected from the group consisting of an elemental chalcogen and a chalcogen-containing compound, with a solvent and a reaction promoter to form a solution;
   (b) continuously passing said solution at a selected flow rate through a thermally conductive reaction tube that is maintained at a temperature sufficiently high to initiate a reaction among said reactants, thereby producing a product mixture containing nanocrystals;
   (c) monitoring said product mixture to detect properties of said nanocrystals that are indicative of the degree to which said nanocrystals possess desired characteristics; and
   (d) comparing the value of said properties thus detected with said target range and adjusting either the temperature of said reaction tube, the flow rate of said solution, or both, if needed to correct any deviation between said value of said detected properties and said target range.

2. A process in accordance with claim 1 in which said properties thus detected are optical properties.

3. A process in accordance with claim 1 further comprising cooling said product mixture between steps (b) and (c) to a temperature sufficiently low to quench said reaction.

4. A process in accordance with claim 3 in which said cooling is achieved by a heat transfer medium in contact with said reaction tube.

5. A process in accordance with claim 1 in which step (c) is performed upon emergence of said product mixture from said reaction tube.

6. A process in accordance with claim 3 in which said cooling is performed by combining additional solvent with said product mixture, said additional solvent being at a temperature and a proportion relative to said product mixture sufficient to achieve a final temperature sufficiently low to quench said reaction.

7. A process in accordance with claim 2 in which said optical features are photoluminescent emission spectra, and step (c) comprises irradiating said product mixture with light and detecting wavelength spectra of photoluminescent energy emitted from said nanocrystals.

8. A process in accordance with claim 2 in which said optical features are absorbance, and step (c) comprises irradiating said product mixture with light and detecting absorbance spectra of said nanocrystals.

9. A process in accordance with claim 2 in which said optical features are light scattering, and step (c) comprises irradiating said product mixture with light and detecting the presence of light scattering by said nanocrystals.

10. A process in accordance with claim 1 in which said thermally conductive reaction tube is a coiled tube cast in a solid block of heat conductive metal.

11. A process in accordance with claim 1 in which temperature maintenance of said reaction tube is achieved by a heat transfer medium maintained at a temperature of at least about 100° C.

12. A process in accordance with claim 11 in which said heat transfer medium is maintained at a temperature of from about 100° C. to about 400° C.

13. A process in accordance with claim 1 in which said reactant (i) is a member selected from the group consisting of dimethyl cadmium and cadmium acetate.

14. A process in accordance with claim 1 in which said chalcogen is a member selected from the group consisting of sulfur, selenium, and tellurium.

15. A process in accordance with claim 1 in which said chalcogen is selenium.

16. A process in accordance with claim 1 in which said nanocrystal comprises a member selected from the group consisting of ZnS, ZnSe, ZnTe, CdS, CdSe, and CdTe.

17. A process in accordance with claim 1 in which said solvent is a member selected from the group consisting of alkyl phosphines, alkyl phosphine oxides, pyridines, furans, ethers, amines, and alcohols.

18. A process in accordance with claim 1 in which said solvent is a member selected from the group consisting of tri n octylphosphine and tri n octylphosphine oxide.

19. A process in accordance with claim 1 in which said solvent is a mixture of tri n octylphosphine and tri n octylphosphine oxide.

20. A process in accordance with claim 11 in which step (d) comprises adjusting the temperature of said heat transfer medium.

21. A process in accordance with claim 1 in which step (d) comprises adjusting the flow rate of said solution.

22. A process for the coating of nanocrystals with a passivating coating to achieve coated nanocrystals having detectable properties within a target range, said process comprising:
   (a) combining nanocrystal cores with surface passivating reactants capable of forming a shell wherein the shell comprises a member selected from the group consisting of CdS, CdSe, ZnS, ZnSe, ZnTe, and alloys and mixtures thereof, and a solvent to form a dispersion;
   (b) continuously passing said dispersion through a thermally conductive reaction tube maintained at a temperature sufficiently high to initiate a reaction among said passivating reactants, thereby producing a product mixture containing nanocrystals coated with a passivating coating;

(c) monitoring said product mixture to detect properties of said nanocrystals that are indicative of the degree to which said nanocrystals possess desired characteristics; and (d) comparing values of said properties thus detected with said target range and adjusting the temperature of said reaction tube, the flow rate of said solution, or both, if needed to correct any deviation between said values of said detected properties and said target range.

23. A process in accordance with claim 1 further comprising heating said nanocrystal-forming reactants prior to step (a).

24. A process in accordance with claim 1 wherein said solvent is a coordinating solvent.

25. A process in accordance with claim 1 wherein step (a) comprises combining said nanocrystal-forming reactants with a coordinating additive in addition to said solvent and said reaction promoter.

26. A process in accordance with claim 1 wherein said reaction promoter is a member selected from the group consisting of oxygen and a reducing agent.

* * * * *